United States Patent [19]
Volk

[11] Patent Number: 5,444,347
[45] Date of Patent: Aug. 22, 1995

[54] SWITCHING APPARATUS WITH AN ELECTOMECHANICAL ADJUSTING DRIVE

[75] Inventor: Raimund Volk, Tuningen, Germany

[73] Assignee: Hommelwerke GmbH, Hanover, Germany

[21] Appl. No.: 189,933

[22] Filed: Feb. 1, 1994

[30] Foreign Application Priority Data

Feb. 4, 1993 [DE] Germany .............. 43 03 125.0

[51] Int. Cl.6 .............................................. H02N 2/06
[52] U.S. Cl. ...................................... 318/632; 318/687; 318/116; 310/311
[58] Field of Search ............... 318/687, 116, 119, 135, 318/575, 615, 632, 634, 652, 663, 671, 672, 686; 310/311

[56] References Cited

U.S. PATENT DOCUMENTS 4,710,691 12/1987 Bergstrom et al. ................ 318/696

FOREIGN PATENT DOCUMENTS 3522994 1/1987 Germany .
3909206 5/1990 Germany .
64-35613 2/1989 Japan .

OTHER PUBLICATIONS

Piezo Guide, Teil 1, Piezostelltechnik in Theorie und Praxis, Mar., 1989.

*Primary Examiner*—Bentsu Ro
*Attorney, Agent, or Firm*—Banner & Allegretti, Ltd.

[57] ABSTRACT

A switching apparatus with an adjusting drive, preferably piezoelectrical, which is connected with a device producing a supply voltage. A second adjusting drive, which is preferably constructed in the same manner as the first adjusting drive, and to which a length measuring device is coupled, which scans the adjusting movement of the adjusting element of the second adjusting drive and produces an output signal, which is connected in a linear manner with the adjusting movement of the adjusting element of the first adjusting drive, is connected with the outlet of the supply voltage producing device. By means of this linear connection, errors which are brought about by hysteresis, drift or temperature in the adjusting drive, which is preferably piezoelectrical, are eliminated.

6 Claims, 2 Drawing Sheets

SWITCHING APPARATUS WITH AN ELECTOMECHANICAL ADJUSTING DRIVE

BACKGROUND OF THE INVENTION

This invention relates to a switching apparatus with an electro-mechanical adjusting drive, of the type including means for the linearization of the adjusting movement of an element of a first adjusting drive in relation to an electrical voltage and a supply voltage producing device which has a control inlet and an outlet for a supply voltage, which is connected with the adjusting drive.

Adjustment drives, particularly piezoelectrical adjustment drives, which are frequently also termed "activators" or "translators", have the disadvantage that their deflection is not linear to the electrical signal which is applied. This non-linearity is particularly disadvantageous, therefore, because it is not constant in time. It can consequently also not be compensated with a coefficient rate which is, to be sure, adjusted individually, but which however, is constant in time. The temporal dependence is based on hysteresis phenomena which depend on the previous history of the course of the voltage on the piezo-element. This hysteresis behavior is not temporally constant but has, rather, a consequence on the basis of a subsequent polarization of the ceramic. There is, in addition, a temporal dependence on the temperature.

A switching apparatus of the type under discussion, with a piezo-electrical adjusting drive in which the means for the linearization of the adjusting movement, which should be independent of the hysteresis, the drift and the temperature, have a measuring system, by means of which the expansion of the piezoelectrical adjusting element is measured, and a corresponding measuring signal, which is superimposed as an ACTUAL-value in a closed control system over a THEORETICAL-value, so that the supply voltage for the piezoelectrical adjusting element changes in the sense of a counter-coupling, and the course of the deflection is linearized to the ACTUAL-value, is already known from the publication "Products for the Micro-Adjustment Technology" by the firm "Physik Instrumente GmbH & Co.,", in Waldbronn.

Expansion measuring strips which adhere to the piezoelectrical element, and which are positioned within a bridging circuit, serve as the measuring system. In another known arrangement of the type which is under discussion (company publication "Queensgate System 2000 Nano-Positioning" by the firm Queensgate Instruments in Berkshire, SL5 7PW, England), the determination of the ACTUAL-position of the piezoelectrical adjusting element is carried out by means of the capacitative measurement of the interval.

Both of these known solutions are time-consuming, expensive and increase, in particular, the volume of the adjusting drive, since the device for the measurement of the ACTUAL-position of the piezoelectrical adjusting element is directly attached to the same.

A positioning device for a cutting edge of a machine tool is already known from JP 64-35613 (A). The cutting tool is held by means of a piezoelement, with the help of which, through the application of a corresponding electrical voltage, the position of the cutting edge of the machine tool can be adjusted, in order to thereby determine the depth of the cutting. By means of a second piezoelectrical element with the same characteristics, an error signal is produced, which is added to the control signal for the adjustment of the cutting edge of the cutting tool, in order to compensate for a dynamic hysteresis of the piezoelement which is adjusting the cutting edge. The linearization of the dependence of the change of the length of the piezoelement holding the cutting tool to its supply voltage is not thereby attained as the result.

The task which forms the basis of the invention is that of creating a switching apparatus of the type under discussion, in which the connection of the adjusting movement of the adjusting element with an electrical voltage, and thereby the linearity, is improved so that more precise conclusions can be made, from the voltage, in regard to the movement of the adjusting element which has actually taken place. The switching apparatus should, furthermore, be simple and inexpensive. The volume of the adjusting drive should not thereby be increased.

The task which forms the basis of the invention is solved by means of the theory which is stated in the characterizing portion of patent claim 1, i.e., providing the means for the linerization with a second adjusting drive which is connected with the outlet of the supply voltage producing device and a first length measuring device is provided which scans the adjusting movement of the adjusting element of the second adjusting drive and produces an output signal which is connected in a linear manner with the adjusting movement of the adjusting element of the first adjusting drive.

The concept which lies at the basis of the invention is that of providing a second adjusting drive, which is stressed with the same supply signal as the first adjusting drive, and consequently carries out the same movements as the first adjusting drive. The movements of this second adjusting drive are measured by means of an electrical length measuring device, the output voltage of which is linearly dependent on the position of movement of the adjusting element of the second adjusting drive. It is consequently also linearly connected with the adjusting movement of the first adjusting drive. It can thus serve as a corresponding reference voltage. It can, for example, be indicated immediately, so that the position of movement of the adjusting element of the adjusting drive is then indicated immediately. The linear connection is then particularly provided if the second adjusting drive is constructed in the same manner as the first adjusting drive. It thus exhibits the same mechanical-electrical behavior. It is of particular advantage that the first electrical length measuring device is not connected with the first, and preferably piezoelectrical, adjusting drive, or has to be positioned in the immediate vicinity of the same. The first adjusting drive is thus completely free of additional elements, so that its volume is not increased by means of additional components. The electrical connection of both of the adjusting drives thus represents no increase of the volume.

If, in addition, the second adjusting drive can also be positioned, with the corresponding length measuring device, in a given place, then it is, as a rule, appropriate to position it as close as possible to the first adjusting drive, so that both adjusting drives are subjected to the same temperature influences. The linearity which is thus attained is consequently also independent of the influences of temperature.

The basic concept of the invention can be additionally formed in various manners. In accordance with the solution which is characterized in patent claim 3, the switching apparatus is further formed as a device for the scanning of the surface of a test piece. The adjusting element of the first adjusting drive moves the test piece in parallel to its surface, so that a second length measuring device scans the contour of the surface of the test piece and produces an electrical output signal which is fed, as a "Y"-signal, into a writing or viewing device, the "X"-signal of which is formed by the output signal of the first length measuring key switch.

Because of the linear condition of the output voltage of the first length measuring key switch with the adjusting movement of the adjusting element of the first adjusting device with the writing or viewing device, the surface contour of the test piece, scanned by the second length measuring device, is written or made visible in the "X"-direction in an undistorted manner.

One other possibility for the further formation of the concept of claim 1 is characterized in patent claim 4, in accordance with which, with the inclusion of the second adjusting drive and the corresponding length measuring device, a control system is formed, on the basis of which the dependence of the movement of the adjusting element of the second adjusting drive is linearized in relation to the control voltage. Since, however, both adjusting drives, which are preferably constructed alike, are stressed with the same supply voltage, it follows from this that the movement of the adjusting element of the first adjusting drive is also linearly connected with the control voltage which is supplied. It is thus possible to record a length (in the direction of movement of the adjusting element or transversely to the same), which is scanned by the surface of a test piece moved by the adjusting element of the first adjusting drive, in linear dependence on the control voltage which is fed in (such as, for example, a THEORETICAL value).

This further formation is particularly suitable in its application in the scanning of a surface contour, if this scanning should take place with a peak, the distance of which should be kept constant in relation to the surface during the movement along the surface, such as is necessary, for example, in the case of scanning microscopes (PHYSICAL REVIEW LETTERS, 1986, pages 930–933), or in acoustical scanning microscopes (DE 38 20 518 C1). In accordance with the invention, there is provided for this purpose a second control system, in which the electrical measuring signal corresponding to the contour of the surface which is measured, in the sense of a counter-coupling, is added to the control signal, which controls the supply voltage for the preferably piezoelectrical adjusting drives.

Additional advantageous configurations are presented in patent claims 5 and 6.

The electrical length measuring devices which are used in accordance with the invention can essentially be of any type that is desired. This may involve inductive, capacitative, interferometric, or other length measuring devices which emit an electrical measuring signal.

BRIEF DESCRIPTION OF THE DRAWING

There is shown in the attached drawing presently preferred embodiments of the present invention, wherein.

DETAILED DESCRIPTION OF THE PRESENT INVENTION

Figure 1:
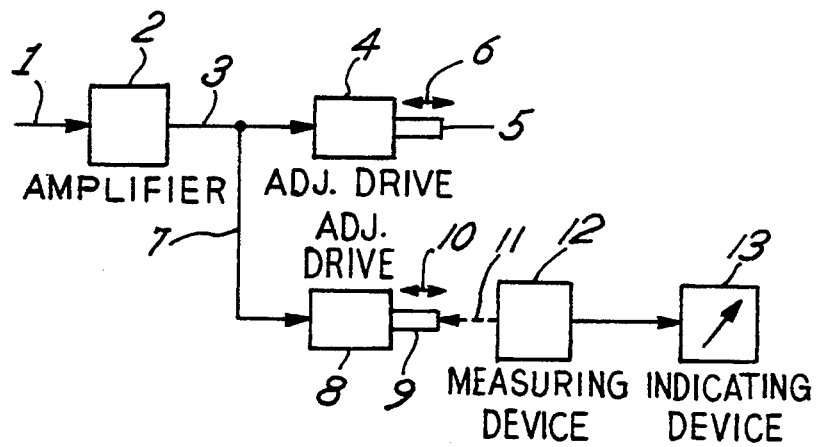
FIG. 1: shows a first example of implementation of the invention.

In the example of implementation is accordance with FIG. 1, a control signal arrives, by way of a control input (1), at a high voltage amplifier (2), the output voltage of which arrives, as a supply voltage, by way of a line (3) at a piezoelectrical adjusting drive (4), with an adjusting clement (5) which expands or contracts, in the direction of a double arrow (6), in a manner which is dependent on the supply voltage within the line (3).

By way of the line (7), the same supply voltage reaches a second piezoelectrical adjusting drive (8), which is constructed in the same manner as the piezoelectrical adjusting drive (4), the adjusting clement (9) of which consequently expands or contracts, in the same manner as the adjusting clement (5) of the adjusting drive (4), in dependence on the supply voltage on the line (7), in the direction of a double arrow (10).

The movements of the adjusting clement (9) are scanned by means of the key switch (11) of a length measuring device (12), which is only depicted schematically here, and the construction of which can be in any manner as is desired. This may therefore involve, for example, an inductive, a capacitative, or even an interferometrical length measuring device. The electrical output signal of the length measuring device (12) is fed into an indicating device (13), which is only depicted schematically here, and the indication of which is linearly connected with the movements of the adjusting element (9).

Since both the adjusting drive (8) as well as the adjusting drive (4) is fed, by way of the lines (7 or 3), with the same supply voltage of the high voltage amplifier (2), and consequently the movements of its adjusting elements (9 or 5) arc identical (apart from manufacturing imprecisions unavoidable in actual practice), the starting voltage of the length measuring device (12), and consequently also the indication of the indicator device (13), is connected linearly with the movement of the adjusting element (5).

In this example of implementation, the indicating device (13) is only connected for the purpose of better understanding. The output voltage of the length measuring device (12) can naturally be utilized, in the manner which is current for every technician, in order to bring its linear dependence into contrast with the movement of the adjusting element (5).

Figure 2:
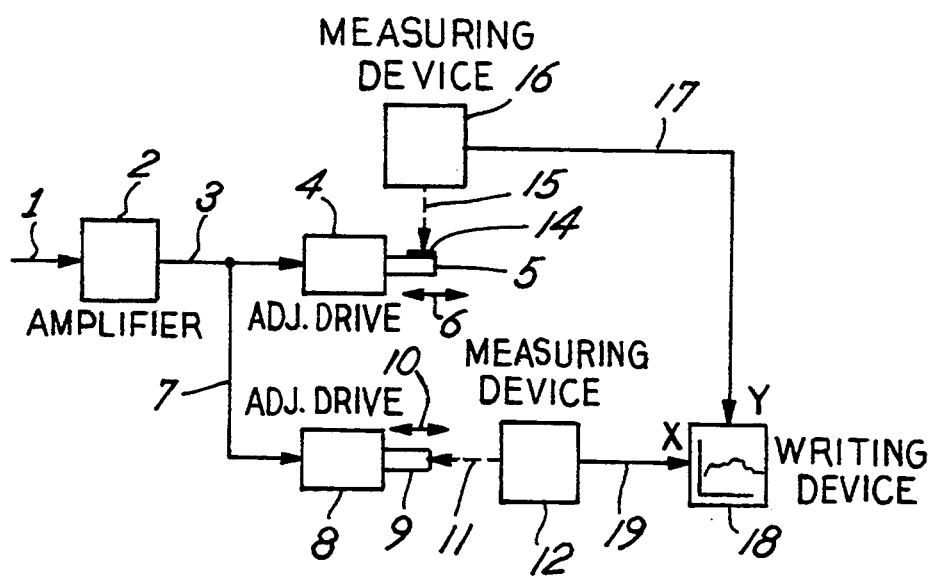
FIG. 2: shows a second example of implementation of the invention.

The example of implementation in accordance with FIG. 2 partially corresponds to that in accordance with FIG. 1. The same or coinciding parts are thus provided with the same reference numbers. One difference consists in the fact that a test piece (14), the surface of which essentially extends in the direction of the double arrow (6), and which is scanned by means of a key switch (15) of a length measuring device (16), the output signal of which is fed in, by way of line (17), as a "Y"-signal, into a writing device (18), the "X" input of which is connected, by way of a line (19), with the outlet of the length measuring device (12), is held to the adjusting element (5).

If the voltage on the control input (1) is changed for the high voltage amplifier (2), then the supply voltages on the lines (3 and 7) correspondingly also change and, consequently, the position of the adjusting elements (5 and 9) of the adjusting drives (4 and 8) change as well. The dependence of the movements of the adjusting elements (5 and 9), which are equal to one another, on the voltage on the control inlet (1), is not linear. It is, however, linearly connected with the measuring voltage at the outlet of the length measuring device (12). This means that the "X"-dimension of the writing device (18) reproduces the course of the movement of the adjusting element (5), and consequently of the surface of the test piece (14) as well, without any distortion. The course of the curve which is reproduced on the writing device (18) thus precisely agrees with the surface contour of the test piece (14), which is moved, in the direction of the surface which is scanned, by means of the adjusting element (5).

Figure 3:
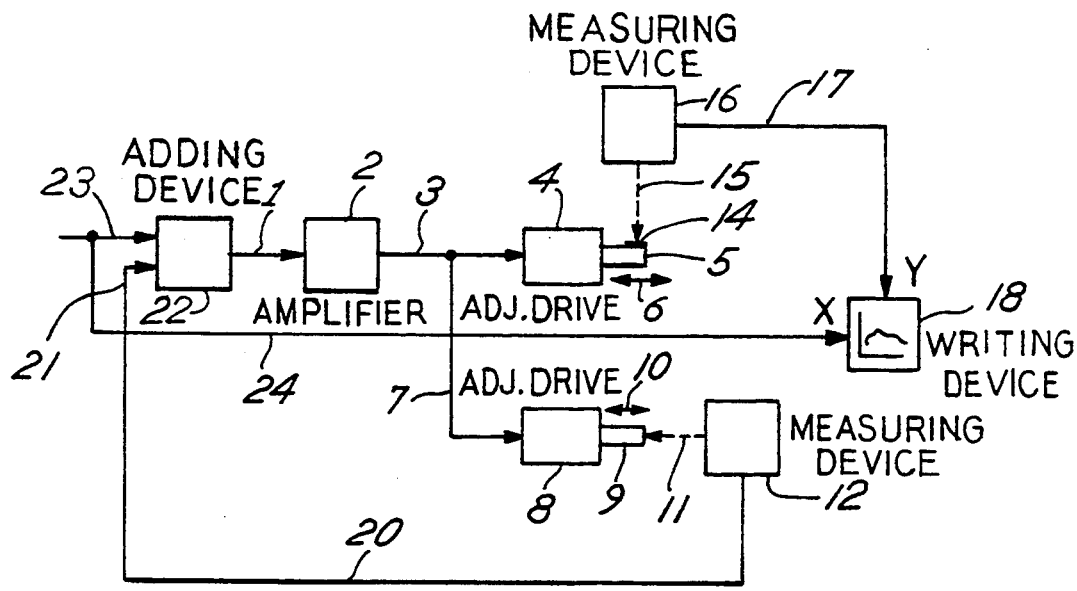
FIG. 3: shows a third example of implementation of the invention, with a regulated supply voltage for the adjusting drive.

FIG. 3 depicts another form of implementation of the invention which is partially in agreement with that in accordance with FIG. 2. The same or coinciding parts are once again provided with the same reference numbers. The difference consists in the fact that the output signal of the length measuring device (12) is fed in, by way of a line (20), in the sense of a counter-coupling, into an input (21) of an adding device (22), the outlet of which, by way of the line (1), controls the high voltage amplifier (2). A control voltage, which is simultaneously applied, by way of a line (24), to the "X"-inlet of the writing device (18), is fed into another input (23).

A regulating circuit is consequently formed, by way of the adding device (22), the high voltage amplifier (2), the line (7), the adjusting drive (8), the adjusting element (9), the key switch (11), the length measuring device (12) and the line (20), back to the adding device (22), with the effect that the movement of the adjusting element (9) is connected more closely, and thus more linearly, with the control voltage on the inlet (23). The control voltage on the input (23) can thus immediately serve as a reference value for the adjustment of the adjusting element (9) and, consequently, also in relation to the position of the adjusting element (5) of the adjusting drive (4) which is in agreement with the same. As the result, therefore, the writing device (18) reproduces, in an undistorted manner, the surface contour of the test piece (14) in the "X"-direction, which is scanned by the key switch (15) and the length measuring device (16).

Figure 4:
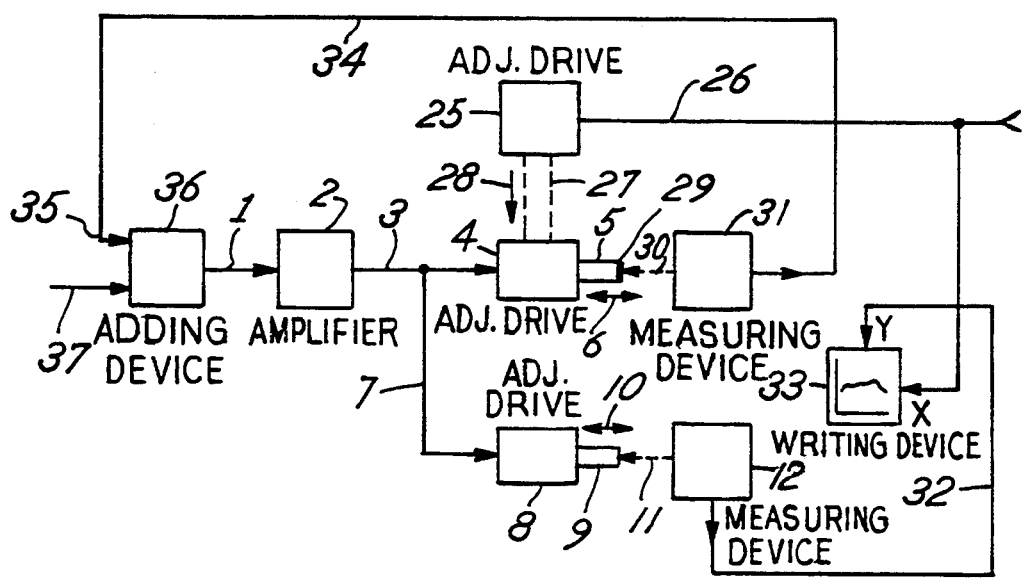
FIG. 4: shows a further formation of the form of implementation, in accordance with FIG. 3.

The example of implementation in accordance with FIG. 4 partially agrees with that in accordance with FIG. 3. The same or corresponding parts are provided with the same reference figures. One difference consists of the fact that a third adjusting drive (25) is provided, which is supplied, by way of a line (26), with a supply voltage so that, in a manner dependence on the same, it moves the adjusting drive (4), which is movable in the direction of the arrow (28), by means of its adjusting element (27). A test piece (29), the surface of which moves transversely to the direction of movement of the adjusting element (5) in the direction of the double arrow (6), in a manner corresponding to the direction of the arrow (28), is positioned on the adjusting element (5) of this unit, at the end of the same.

The contour of the surface of the test piece (29) is scanned by means of a key switch (30) of a length measuring device (31), the output voltage of which moves, by way of a line (34) and an inlet (35), into an adding device (36) and into a control inlet (1) of the high voltage amplifier (2). The output of the length measuring device (31) is connected, by way of a line (32), with the "Y"-input of a writing device (33), the "X"-input of which is stressed with the control voltage of the line (26). An adjustment voltage can be applied to another input (37) of the adding device (36).

If, during the operation, the voltage on the line (26) changes, such as, for example, increasing in a jagged manner, then the adjusting drive (25) moves the adjusting drive (4), by way of the adjusting element (27), and thereby the test piece (29) as well, in the direction of the arrow (28). The key switch (30) of the length measuring device (31) thereby scans the contour of the surface of the test piece (29), and a signal which is dependent on the same appears on the line (34) which, in the manner of a counter-coupling in a regulating loop, influences the supply voltage of the high voltage amplifier (2) for the piezoelectrical adjusting drive (4), by way of the adding device (36), with the tendency that the adjusting element (5), in keeping the distance of the surface of the rest piece (29) to the key switch or to the length measuring device (31) constant, moves in the direction of the double arrow (6). These are the scanning conditions which are desired, for example, in a scanning microscope. Since the adjusting drive (8) is constructed in the same manner as the adjusting drive (4), and is stressed by the same supply voltage from the high voltage amplifier (2), its adjusting element (9) carries out the same movement as the adjusting element (5) of the adjusting drive (4) with the test piece (29) which is attached to the same. The length measuring device (12) consequently measures, on the adjusting element (9), the movements of the adjusting element (5) in the representative manner and so, consequently, the course of the surface contour of the test piece (29) which is registered by means of the writing device (33). The size of the distance between the surface of the test piece (29) and the key switch (30) can be adjusted by means of the adjustment voltage at the input (37) of the adding device.

I claim:

1. A switching apparatus with an electromechanical adjusting drive including means for linearization of adjusting movement of an adjusting element of a first adjusting drive, in relation to an electrical voltage; and a supply voltage producing device which has a control inlet and an outlet for a supply voltage, which is connected with the first adjusting drive; characterized in that: the means for the linearization have a second adjusting drive (8), which is connected with the outlet of the supply voltage producing device; and a first length measuring device (12) is provided which scans the adjusting movement of an adjusting element (9) of the second adjusting drive (8), and produces an output signal which is connected in a linear manner with the adjusting movement of the adjusting element (5) of the first adjusting drive (4).

2. A switching apparatus in accordance with claim 1, characterized in that, the second adjusting drive (8) is constructed in the same manner as the first adjusting drive (4).

3. A switching apparatus is accordance with claim 1, characterized in that: a second length measuring device (16) is provided, which scans one surface of a test piece (14) connected with the adjusting element (5) of the first adjusting drive (4), and moved by the surface of the adjusting element (5); and the outlets of the first and second length measuring device (12, 16) are connected to both inlets of a writing or viewing drive (18).

4. A switching apparatus in accordance with claims 1 or 2, characterized in that an adding device (22) is provided, to the one inlet (23) of which a control voltage is connected, and to the other inlet (21) of which the output signal of the first length measuring device (12) is connected, the outlet of said adding device is connected to the control inlet (1) of the supply voltage producing device (2).

5. A switching apparatus in accordance with claim 4, characterized in that a second length measuring device (16) is provided, which scans a surface of a test piece (14) connected with the adjusting element (5) of the first adjusting drive (4), and moved by the surface of the adjusting element (5); a writing or viewing device (18) with an "X"-inlet connected to the control inlet and a "Y"-inlet connected to the outlet of the second length measuring device (16).

6. A switching apparatus in accordance with claim 4, characterized in that a third adjusting drive (25) is provided for the movement of the first adjusting drive (4) transversely to the direction of the adjusting movement of the same; a third length measuring device (31) is provided for the scanning of a surface, proceeding transversely to the direction of movement of the adjusting element (5) of the first adjusting drive (4), of a test piece (29) which is held by the adjusting element (5) of the first adjusting drive (4); a writing or viewing device (33) is provided, to the "X"-inlet of which is connected to the control voltage for the third adjusting drive (25), and to the "Y"-inlet of which the output signal of the first length measuring device (12) is connected, and a second adding device (36), to one inlet (37) of which an adjusting voltage is connected, and to the other inlet (35) of which the output voltage of the second length measuring device (31) is connected.

* * * * *